(12) United States Patent
Behrendt et al.

(10) Patent No.: US 9,139,427 B2
(45) Date of Patent: Sep. 22, 2015

(54) METHODS FOR PRODUCING A CAVITY WITHIN A SEMICONDUCTOR SUBSTRATE

(71) Applicant: Infineon Technologies AG, Neubiberg (DE)

(72) Inventors: Andreas Behrendt, Villach (AT); Kai-Alexander Schreiber, Villach (AT); Sokratis Sgouridis, Annenheim (AT); Martin Zgaga, Rosegg (AT); Bernhard Winkler, Regensburg (DE)

(73) Assignee: Infineon Technologies AG, Neubiberg (DE)

(*) Notice: Subject to any disclaimer, the term of this patent is extended or adjusted under 35 U.S.C. 154(b) by 152 days.

(21) Appl. No.: 13/864,762

(22) Filed: Apr. 17, 2013

(65) Prior Publication Data
US 2013/0270658 A1    Oct. 17, 2013

(30) Foreign Application Priority Data

Apr. 17, 2012   (DE) .................. 10 2012 206 328
Apr. 20, 2012   (DE) .................. 10 2012 206 531

(51) Int. Cl.
*H01L 21/311*       (2006.01)
*B81C 1/00*         (2006.01)
(Continued)

(52) U.S. Cl.
CPC ........... *B81C 1/00626* (2013.01); *B81B 3/0094* (2013.01); *B81C 1/00619* (2013.01); *B81B 2203/033* (2013.01); *B81C 2201/0139* (2013.01); *H01L 21/3063* (2013.01)

(58) Field of Classification Search
CPC ............... H01L 21/3063; H01L 21/30655; B81C 2201/0112; B81C 2201/0139
See application file for complete search history.

(56) References Cited

U.S. PATENT DOCUMENTS 4,264,382 A    4/1981   Anantha et al.
4,317,126 A    2/1982   Gragg
(Continued)

FOREIGN PATENT DOCUMENTS

CN    101267689 A    9/2008
CN    101479185 A    7/2009
(Continued)

OTHER PUBLICATIONS

BOSCH, Research Info, *Revolution Under the Hood*, http://researchinfo.bosch.com, Issue Jan. 2003, 4 pages.
(Continued)

*Primary Examiner* — Steven J Fulk
(74) *Attorney, Agent, or Firm* — Eschweiler & Associates, LLC

(57) ABSTRACT

A method for producing at least one cavity within a semiconductor substrate includes dry etching the semiconductor substrate from a surface of the semiconductor substrate at at least one intended cavity location in order to obtain at least one provisional cavity. The method includes depositing a protective material with regard to a subsequent wet-etching process at the surface of the semiconductor substrate and at cavity surfaces of the at least one provisional cavity. Furthermore, the method includes removing the protective material at least at a section of a bottom of the at least one provisional cavity in order to expose the semiconductor substrate. This is followed by electrochemically etching the semiconductor substrate at the exposed section of the bottom of the at least one provisional cavity. A method for producing a micromechanical sensor system in which this type of cavity formation is used and a corresponding MEMS are also disclosed.

11 Claims, 12 Drawing Sheets

(51) Int. Cl.
*B81B 3/00* (2006.01)
*H01L 21/3063* (2006.01)

(56) References Cited

U.S. PATENT DOCUMENTS

| | | | |
|---|---|---|---|
| 4,437,226 A | | 3/1984 | Soclof |
| 4,966,663 A | * | 10/1990 | Mauger .................. 205/656 |
| 4,995,953 A | | 2/1991 | Yee |
| 5,129,981 A | * | 7/1992 | Wang et al. ............. 205/646 |
| 5,167,778 A | * | 12/1992 | Kaneko et al. .......... 205/656 |
| 5,332,469 A | * | 7/1994 | Mastrangelo ............... 216/2 |
| 5,445,718 A | | 8/1995 | Wang |
| 5,501,893 A | * | 3/1996 | Laermer et al. .......... 428/161 |
| 5,719,073 A | | 2/1998 | Shaw |
| 5,968,336 A | * | 10/1999 | Rolfson .................. 205/656 |
| 6,006,607 A | | 12/1999 | Bryzek |
| 6,093,330 A | * | 7/2000 | Chong et al. ............... 216/2 |
| 6,122,964 A | | 9/2000 | Mohaupt |
| 6,357,299 B1 | * | 3/2002 | Aigner et al. ............. 73/754 |
| 6,379,990 B1 | | 4/2002 | Muller |
| 6,531,068 B2 | * | 3/2003 | Laermer et al. ........... 216/37 |
| 6,653,702 B2 | | 11/2003 | Ishio |
| 6,662,663 B2 | | 12/2003 | Chen |
| 7,288,824 B2 | | 10/2007 | Partridge |
| 7,300,854 B2 | | 11/2007 | Benzel |
| 7,629,657 B2 | | 12/2009 | Partridge |
| 7,833,405 B2 | | 11/2010 | Benzel |
| 7,859,067 B2 | | 12/2010 | Partridge |
| 2002/0020053 A1 | * | 2/2002 | Fonash et al. ........... 29/623.1 |
| 2002/0086456 A1 | * | 7/2002 | Cunningham et al. ....... 438/57 |
| 2002/0086551 A1 | * | 7/2002 | Beetz et al. ............. 438/745 |
| 2002/0137348 A1 | * | 9/2002 | Mlcak .................... 438/695 |
| 2002/0148807 A1 | * | 10/2002 | Zhao et al. ................. 216/2 |
| 2002/0185469 A1 | * | 12/2002 | Podlesnik et al. .......... 216/41 |
| 2004/0067346 A1 | * | 4/2004 | Hofmann et al. ........ 428/195.1 |
| 2005/0176198 A1 | * | 8/2005 | Kudelka ................. 438/243 |
| 2005/0260783 A1 | | 11/2005 | Lutz |
| 2006/0231521 A1 | * | 10/2006 | Chilcott ..................... 216/2 |
| 2006/0292877 A1 | * | 12/2006 | Lake ..................... 438/694 |
| 2007/0077727 A1 | * | 4/2007 | Huang et al. ............. 438/444 |
| 2007/0170528 A1 | | 7/2007 | Partridge |
| 2008/0061029 A1 | | 3/2008 | Lai |
| 2008/0237756 A1 | | 10/2008 | Partridge |
| 2008/0293250 A1 | * | 11/2008 | Dussart et al. ............ 438/712 |
| 2009/0007681 A1 | | 1/2009 | Stewart |
| 2009/0309175 A1 | | 12/2009 | Partridge |
| 2010/0147070 A1 | * | 6/2010 | Jun et al. ............... 73/335.05 |
| 2010/0260974 A1 | | 10/2010 | Artmann et al. |
| 2010/0313660 A1 | * | 12/2010 | Nishikage et al. ....... 73/514.32 |
| 2011/0132872 A1 | * | 6/2011 | Van De Sande et al. ....... 216/57 |
| 2011/0207323 A1 | * | 8/2011 | Ditizio .................. 438/675 |
| 2012/0126346 A1 | * | 5/2012 | Hoechst et al. ........... 257/416 |
| 2012/0205753 A1 | * | 8/2012 | Adams et al. ............ 257/415 |
| 2012/0235254 A1 | | 9/2012 | Mohanakrishnaswamy |
| 2012/0264249 A1 | * | 10/2012 | Kundalgurki et al. ....... 438/50 |

FOREIGN PATENT DOCUMENTS

| | | |
|---|---|---|
| CN | 102328899 A | 1/2012 |
| CN | 102328900 A | 1/2012 |
| DE | 40 00 496 A1 | 2/1991 |
| DE | 197 00 290 A1 | 7/1998 |
| JP | 07-249608 A | 3/1997 |
| WO | WO 2007/087021 | 8/2007 |
| WO | WO 2010/052684 A2 | 5/2010 |

OTHER PUBLICATIONS

Dr. Peter Ernst, *MEMS @ BOSCH: Automotive Applications and Beyond*, Jun. 4, 2007, 9 pages.

Vigna, Benedetto, EE Times, *Making Mems: A Short Guide*, Oct. 7, 2008, 2 pages.

LPS001WP, MEMS pressure sensor 300-1100 mbar absolute digital output barometer, Doc ID 18171, Rev. 1, Nov. 2010, pp. 1-30.

SiTime: It's About Time, *SiTime's MEMS First™ Process*, SiT-AN20001 Rev. 1.7, Feb. 17, 2009, pp. 1-6.

Application and File History for U.S. Appl. No. 13/032,334, filed Feb. 22, 2011, Inventors: Winkler et al.

Rogers, T., Selective Anodization Using Masked Deep Ion Implantation, J. Micromech. Micreng. 3 (1993), p. 146-148.

Prime Faraday Technology Watch. ISBN 1-84402-020-7. An Introduction to MEMS (Micro-electromechanical Systems). Jan. 2002.

Semiconductor Materials Product Guide, MEMC at p. 5 downloaded from http://sunedisonsilicon.com/assets/file/products/semiconductor/SunEdison_Semiconductor_Brochure.pdf, on Aug. 29, 2013.

Definition of standard downloaded from http://www.thefreedictionary.com/standard on Sep. 2, 2013.

Chinese Office Action, Chinese Application No. 2012100381292, dated Jun. 24, 2014, 8 pages.

German Office Action, German Application No. 10 2012 206 531.8, mailed Oct. 10, 2014, 8 pages.

German Office Action, German Application No. 10 2012 202 643.6, mailed Oct. 23, 2014, 7 pages.

German Office Action, German Application No. 10 2012 206 531.8, mailed Feb. 20, 2014, 4 pages.

* cited by examiner

METHODS FOR PRODUCING A CAVITY WITHIN A SEMICONDUCTOR SUBSTRATE

RELATED APPLICATIONS

This application claims priority to German Patent Application No. 102012206531.8, filed Apr. 20, 2012, which in turn claims priority to German Patent Application No. 102012206328.5, filed Apr. 17, 2012, each of which is incorporated herein by reference in its entirety.

TECHNICAL FIELD

Exemplary embodiments provide methods for producing at least one cavity within a semiconductor substrate. Further exemplary embodiments provide a microelectromechanical system.

BACKGROUND

Some microelectromechanical systems (MEMS) as well as some highly integrated components appertaining to microelectronics require relatively deep cavities, holes or cutouts. By way of example, in MEMS technology the actual MEMS structures are often patterned at a first surface of a semiconductor substrate (for example the upper surface or a front side). Depending on the type of MEMS component, it may be necessary for these structures present at the first surface or at the front side also to be made accessible from a second surface or rear side of the semiconductor substrate, wherein the second surface is arranged opposite to the first surface with respect to the semiconductor substrate. One example is a pressure sensor whose membrane is provided at the first surface or front side of the semiconductor substrate by means of a MEMS technology, but additionally also requires an access from the second surface or rear side, via which access the membrane can be subjected to the pressure to be measured. Further examples are acoustic transducers (loudspeaker or microphone) and acceleration sensors. The production of cavities on silicon wafers (generally: wafers composed of semiconductor material) which are used for the production of MEMS (microelectromechanical systems) components (for example pressure and acceleration sensors) of any type (sensors and actuators) constitute a frequently occurring objective in MEMS technology.

At the present time, these cavities are typically implemented in ultra-pure silicon by means of anisotropic electrochemical etching in TMAH (tetramethylammonium hydroxide). Etching using TMAH is a wet-chemical etching method. Purely wet-chemically etched cavities typically have a relatively large extent in terms of area, since etching is performed selectively with a naturally predefined sidewall angle of 54.7° (etching-selectively predefined crystal angle between the Si <100> and Si <111> planes). To put it another way, typically only a relatively low aspect ratio can be obtained with a wet-chemical etching method. Aspect ratio typically denotes the ratio of the depth of a structure to its (smallest) lateral extent.

The wet-chemical etching methods also include so-called electrochemical etching. Electrochemical etching (ECE) for dopant-selective removal of silicon is a method for automating and selectively controlling the etching process. In general, an active pn junction is required and both types of dopants can serve as an etching-resistant material ("etching stop"). Electrochemical etching can be used in combination with an anisotropic etching method in order to be able to control for example the thickness of MEMS structures (e.g. membrane thickness in the case of piezoresistive pressure sensors) with high accuracy. The selectively doped regions required for this purpose can be created for example by implantation, diffusion or epitaxial deposition of silicon or some other semiconductor material. The etching depth (and thus, if appropriate, also the thickness of corresponding MEMS structures) can be controlled in an electrochemical etching method with an accuracy of approximately 0.05 µm, under certain circumstances even with an accuracy of approximately 0.03 p.m.

It would be desirable to be able to provide a method for producing at least one cavity within a semiconductor substrate which combines the possibility of an etching stop that is controllable with relatively high accuracy with the highest possible obtainable aspect ratio of the cavity produced. Alternatively or additionally it would be desirable to be able to produce one or more cavities in a semiconductor substrate which require as little area as possible at the surface from which cavity(-ies) proceed(s). Furthermore, it would alternatively or additionally be desirable to be able to produce one or more relatively deep cavities in a semiconductor substrate as cost-effectively and/or as rapidly as possible.

SUMMARY

This/these object(s) is/are achieved by embodiments of methods for producing at least one cavity in a semiconductor substrate, methods for producing a microelectromechanical system, and microelectromechanical systems disclosed herein.

Exemplary embodiments provide a method for producing at least one cavity within a semiconductor substrate. The method comprises: dry etching the semiconductor substrate, depositing a protective material, removing the protective material and electrochemically etching the semiconductor substrate. Dry etching the semiconductor substrate is effected from a surface of the semiconductor substrate at at least one intended cavity location in order to obtain at least one provisional cavity. The protective material is deposited with regard to a subsequent wet-etching process at the surface of the semiconductor substrate and at cavity surfaces of the at least one provisional cavity. When relieving the protective material, the latter is removed at least at a section of a bottom of the at least one provisional cavity in order to expose the semiconductor substrate. The semiconductor substrate is then electrochemically etched at the exposed section of the bottom of the at least one provisional cavity.

Further exemplary embodiments provide a method for producing at least one cavity within a semiconductor substrate. The method comprises carrying out a Bosch process at a substrate surface of the semiconductor substrate in order to form at least one provisional cavity. The method furthermore comprises carrying out a plasma chemical vapour deposition of a silicon oxide at the substrate surface and at cavity surfaces of the at least one provisional cavity. Furthermore, the method comprises anisotropically etching the silicon oxide at least at a section of a bottom of the at least one provisional cavity. The method also comprises electrochemically anisotropically etching the semiconductor substrate using an electrochemically controlled pn etching stop, wherein the electrochemical anisotropic etching is effected at least at the section of the bottom of the at least one provisional cavity and extends the at least one provisional cavity in this way.

Further exemplary embodiments provide a method for producing a micromechanical sensor system. The method comprises providing a doped semiconductor substrate. The method then involves redoping at least one redoped region within the doped semiconductor substrate, wherein the at least one redoped region is situated at a specific depth from a substrate surface of the semiconductor substrate. The method also comprises carrying out a patterning process for producing microelectromechanical structures in the semiconductor substrate and at the substrate surface. At least one portion of the microelectromechanical structures provided extends into the redoped region. The method for producing at least one cavity within the semiconductor substrate which has already been mentioned above is then carried out. The cavity produced, after completion, adjoins the redoped region and that portion of the microelectromechanical structures which extends into the redoped region.

In accordance with further exemplary embodiments, a microelectromechanical system comprises a semiconductor substrate having a surface and a cavity formed in the semiconductor substrate. A sidewall of the cavity comprises a first section and a second section, which is further away from the surface of the substrate. The first section extends at a first angle with respect to the surface, which first angle is between 70° and 110°. The second section extends at a second angle with respect to the surface, which second angle is between 40° and 65°.

Exemplary embodiments are based on the fact that an anisotropic etching process performed initially contributes to obtaining the highest possible aspect ratio or the smallest possible area requirement of the cavity(-ies) to be produced. This anisotropic etching process is then superseded by an electrochemical etching method, thus resulting in a relatively exact control of the depth of the cavity(-ies) to be produced.

The dry etching employed first yields, as far as a certain etching depth, substantially perpendicular etching sidewalls which, in combination with the subsequent process steps, make it possible to reduce the chip area required for the sensors. A process for producing the semiconductor components (e.g. silicon components) with a smaller total area is thus made possible.

The method for producing at least one cavity within a semiconductor substrate can furthermore comprise depositing an oxide mask for dry etching the semiconductor substrate. The oxide mask is typically deposited and patterned prior to dry etching. The oxide mask is locally removed at the at least one intended cavity location, e.g. by means of a lithography process.

Dry etching the semiconductor substrate can comprise at least one of the following processes: reactive ion etching (RIE), deep reactive ion etching (DRIE) and a Bosch process. These etching methods are generally highly anisotropic, such that the provisional cavity(-ies) produced by these processes acquire(s) steep sidewalls. Other anisotropic etching methods or generally patterning methods are likewise conceivable.

The protective material can be an oxide, in particular a silicon oxide and/or a spacer oxide. In general, the choice of protective material will depend on how the protective material behaves during the subsequent electrochemical etching process, in particular whether it is attacked relatively little by the electrochemical etching process, whereas the substrate material is etched relatively rapidly. To put it another way, the protective material can be chosen so as to utilize or obtain the highest possible selectivity of the electrochemical etching between the semiconductor substrate material and the protective material.

Depositing the protective material can comprise a plasma deposition, a thermal oxide deposition or a combination thereof.

Removing the protective material can comprise plasma etching. The plasma etching of the protective materials should typically be anisotropic.

The method for producing at least one cavity within a semiconductor substrate can, prior to removing the protective material, furthermore comprise depositing a mask and patterning the deposited mask. What can be achieved in this way is that the protective material is removed only at specific locations, such as at the at least one section of the bottom of the at least one provisional cavity as already mentioned. In exemplary embodiments, provision can also be made for removing the protective material substantially at the entire bottom of the cavity. Since the depth of the provisional cavity is typically intended to be increased, what is achieved by removing the protective layer at the bottom of the provisional cavity (or at at least one section thereof) is that the bottom (section) exposed in this way is available as an attack area for the subsequent electrochemical etching process. By contrast, other, non-exposed surfaces of the semiconductor substrate are protected by the protective material and will accordingly not be affected by the electrochemical etching process.

A basic etching medium can be used for the electrochemical etching.

The electrochemical etching can provide an etching stop technique, e.g. by applying an electrical voltage between the semiconductor substrate and an electrode present in the etching medium.

The method for producing at least one cavity can furthermore comprise carrying out a lithography process and a subsequent implantation in order to form a pn junction at a depth within the semiconductor substrate, wherein the depth of the pn junction is a function of a desired depth of the bottom of the at least one cavity.

The electrochemical etching can comprise a first temporal segment and a second temporal segment. An electrical voltage applied to the semiconductor substrate can be increased during the first temporal segment. During the second temporal segment, the voltage achieved can for example be kept constant or reduced again. The reference potential of the electrical voltage applied to the semiconductor substrate will generally be related to an electrode which is situated in the etching medium or is in contact with the etching medium. The increase in voltage can relate to an absolute value of the electrical voltage. The electrical voltage is typically applied to the substrate at that side of the pn junction which is opposite to the surface from which the cavities are produced. In this way, at least part of the applied electrical voltage is dropped across the pn junction.

The etching medium used for electrochemical etching can comprise e.g. tetramethylammonium hydroxide (TMAH), an aqueous solution of ethylenediamine and pyrocatechol (EDP), hydrazine, potassium hydroxide (KOH) or a combination thereof.

In accordance with exemplary embodiments of the microelectromechanical system, the latter can furthermore comprise a pn junction within the semiconductor substrate. In this case, the pn junction can be arranged or situated on a side of a bottom of the cavity that is opposite to the cavity. However, it is also possible for the pn junction to be substantially at a level with the bottom of the cavity, i.e. pn junction and bottom of the cavity are situated substantially at the same depth or in the same depth range, measured from one of the substrate surfaces.

The first section of the sidewall of the cavity is relatively near the surface with respect to the surface of the semiconductor substrate from which the cavity proceeds and/or extends into the semiconductor substrate. By contrast, the second section can be deeper within the semiconductor substrate.

In the first section, the sidewall of the cavity can have a structure having a plurality of hollow grooves or indentations lying one above another. Such a structure typically indicates that the cavity or a first section of the cavity was produced by means of a Bosch process. In comparison with a cross section of the first cavity section, a second cavity section, which is substantially assigned to the second section of the sidewall, can have a larger cross section.

In exemplary embodiments, the microelectromechanical system can comprise a sensor, an actuator, a pressure sensor, an acceleration sensor or an electromechanical transducer.

A substrate section between a bottom of the cavity and the surface or some other surface of the semiconductor substrate can form a membrane, a beam, a cantilever arm or a mechanical mass element of the microelectromechanical system. Other structures which are used within microelectromechanical systems for obtaining a specific function are likewise conceivable.

In exemplary embodiments of the microelectromechanical system, the substrate can principally consist of silicon, apart from desired and/or undesired impurities (dopings) and, if appropriate, material conversions (e.g. locally delimited oxidation or oxide layer formation).

In exemplary embodiments, the sidewall can have at least one step or edge which forms e.g. a transition between the first sidewall section and the second sidewall section. Also within the second sidewall section itself, the sidewall can have a step or edge.

The aspect ratio of the cavity can be 1.5 or more in exemplary embodiments.

BRIEF DESCRIPTION OF THE DRAWINGS

Exemplary embodiments are described in greater detail below with reference to the accompanying figures, in which.

DETAILED DESCRIPTION

Figure 1:
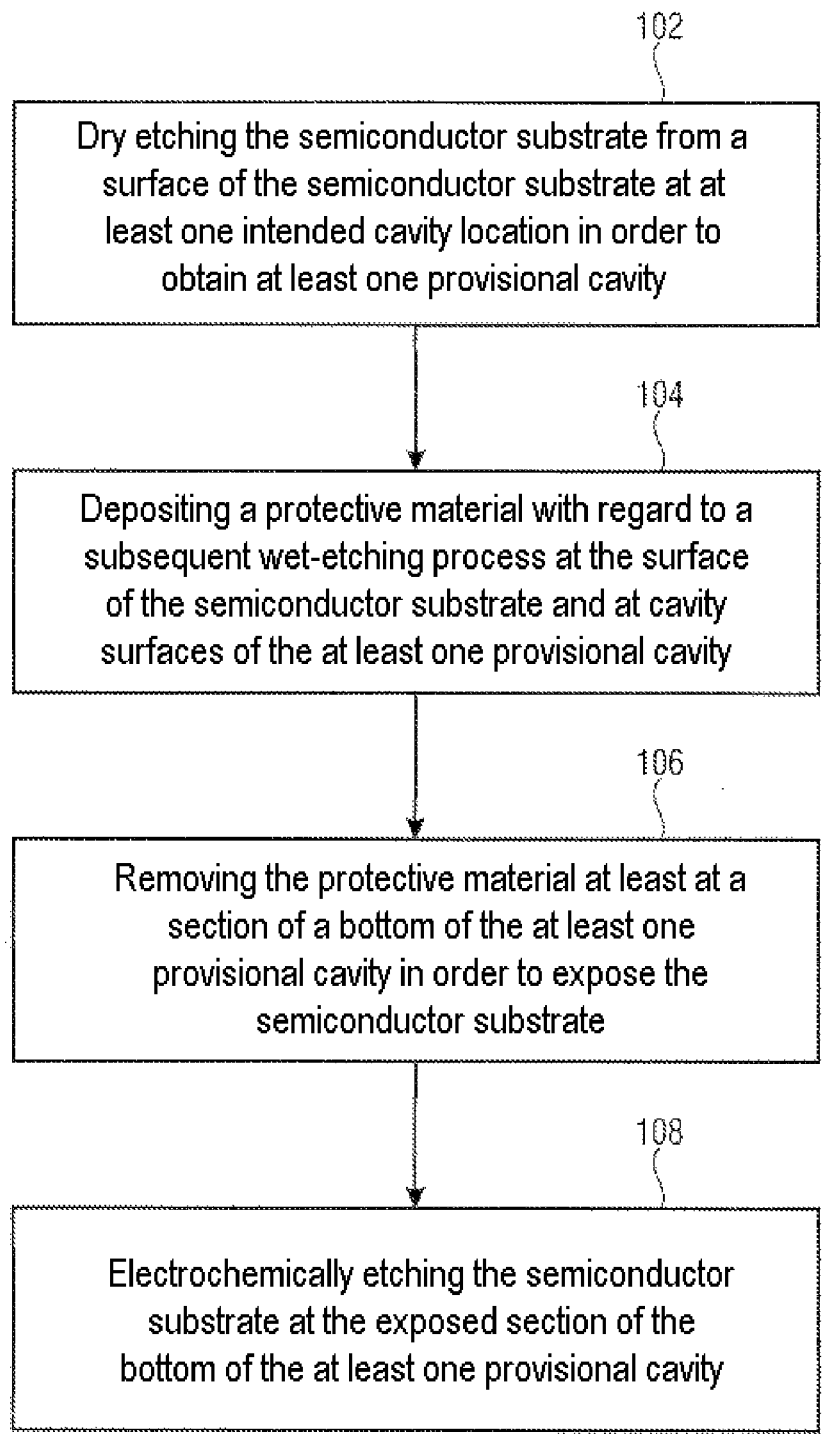
FIG. 1 shows a schematic flowchart of a method for producing at least one cavity within a semiconductor substrate in accordance with exemplary embodiments.

Before exemplary embodiments are explained below with reference to the accompanying figures, it is pointed out that identical elements or elements having an identical function are provided with the same or similar reference signs, and that a repeated description of said elements is dispensed with. The descriptions of elements having identical or similar reference signs are therefore mutually interchangeable. One feature or a plurality of features of one exemplary embodiment can be combined with one feature or a plurality of features of another exemplary embodiment or be replaced thereby.

In MEMS technology, most of the microelectromechanical structures are usually formed at the substrate surface. In particular, in this case the substrate material itself can be patterned, and further materials can also be deposited at the substrate surface and patterned, with the result that the final microelectromechanical structure typically has a layer construction. In some microelectromechanical systems, however, it may furthermore be necessary or expedient to provide an access to the microelectromechanical structures from the opposite substrate surface, too. By way of example, a pressure sensor may require a feed channel via which the pressure to be measured is fed to the membrane patterned as a microelectromechanical component. In the case of an acceleration sensor, it may be necessary or expedient for the mechanical mass element, which serves for detecting the acceleration, to be able to be deflected far enough, for which purpose a sufficiently large free space around the mass element has to be provided in order not to impede this deflection. In these and further examples, it is possible to provide cavities in the semiconductor substrate which are shaped from a rear side of the substrate (that is to say opposite to the surface at which the microelectromechanical structures are formed).

Exemplary embodiments serve for producing cavities on silicon wafers (or more generally: wafers composed of semiconductor material) which are used for producing MEMS components (e.g. pressure and acceleration sensors) of any type (sensors and actuators). In order to produce said cavities in the bulk material of ultra-pure silicon of MEMS components, a so-called "combination process" is used here, which comprises process steps that follow in the sequence typically on different process apparatuses:

1. Dry etching (DRIE "Deep reactive ion etching"/Bosch process) using an oxide hard mask
2. Depositing a spacer oxide and etching an oxide spacer structure as sidewall protection for the subsequent wet-chemical etching
3. Electrochemical anisotropic etching in TMAH The Bosch etch employed first (in step 1) yields etching sidewalls that are perpendicular as far as a certain etching depth, which in combination with the two subsequent process steps (2. and 3.) makes it possible to reduce the chip area required for the sensors. A process for producing the silicon components (generally semiconductor components) with a smaller total area is thus made possible.

In this example described in an exemplary fashion here, the combination process in accordance with exemplary embodiments makes possible a chip size of 4.08 $mm^2$; at the present time, the MEMS silicon sensor area is 6.49 $mm^2$ for a comparable structure (37% area saving). The reduced sensor component area is made possible by using the Bosch etching process that yields etching sidewalls that run perpendicularly. Depending on the depth (etching process duration) of the Bosch etch, the area of the cavities and thus that of the silicon MEMS sensor components can be reduced further. There is a restriction in the etching depth in the Bosch etching process in that, starting from a specific etching depth, no downstream pn etch can be effected since the space charge zone (abbreviated to SCZ) of the pn junction is already reached in the depth of the substrate and a self-aligned etching stop is not obtained.

FIG. 1 shows a schematic flowchart of a method for producing at least one cavity within a semiconductor substrate in accordance with exemplary embodiments. A step 102 involves dry etching the semiconductor substrate firstly from a surface of the semiconductor substrate at at least one intended cavity location in order to obtain at least one provisional cavity. The dry etching can comprise reactive ion etching (RIE) or deep reactive ion etching (DRIE).

As can be seen in the flowchart of FIG. 1 in step 104, a protective material is then deposited. The protective material is deposited with regard to a subsequent wet-etching process (in step 108, see below) at the surface of the semiconductor substrate and at cavity surfaces of the at least one provisional cavity. The protective material can be deposited substantially over the whole area and isotropically, such that surfaces of the substrate or of the at least one cavity are covered with the protective material substantially independently of their orientation. In many cases, an oxide of the substrate material is suitable as protective material. The protective material can be e.g. a spacer oxide. In this case, step 104 can also be designated as spacer deposition. In concrete terms, silane can be used as protective material, but other protective materials are also possible and in no way excluded.

Subsequently, the protective material is removed at least at a section of a bottom of the at least one provisional cavity in order to expose the semiconductor substrate there, as indicated in a step 106 of the schematic flowchart of FIG. 1. As a result of the interaction of steps 104 (deposition of the protective material) and 106 (selective local removal of the protective material), the semiconductor substrate is protected almost everywhere against the subsequent wet-chemical etching process or electrochemical etching, apart from at the exposed section(s). This exposed section or the exposed sections can be situated at the bottom of the at least one provisional cavity, such that the subsequent wet-chemical or electrochemical etching process removes or attacks the substrate at this/these location(s) and thus makes the cavity deeper, without widening the opening of the cavity at the surface. This is illustrated in a step 108 of the schematic flowchart of FIG. 1, according to which electrochemical etching of the semiconductor substrate at the exposed section of the bottom of the at least one provisional cavity is carried out. Depending on the choice of electrochemical etching process or wet-chemical etching process, a more or less pronounced widening of the cavity within the section produced by the electrochemical or wet-chemical etching may occur. This widening of the cavity scales with the additional depth obtained by the electrochemical etching for the cavity in the context of step 108. In comparison with production of the cavity which is based only on electrochemical etching, with the method for producing at least one cavity in accordance with exemplary embodiments it is possible to produce cavities which have, with a comparable depth, a smaller lateral extent than other methods.

The choice of the depth to which step 102 of dry etching is carried out and the further shaping of the cavity is subsequently continued by the electrochemical etching in accordance with step 108 can be adapted to the conditions and requirements of the respective process or of the microelectromechanical systems to be produced. This choice of the proportions of dry etching and of electrochemical etching can e.g. take account of the different etching rates and resultant process durations of the two etching processes, the costs thereof (both with regard to the required apparatuses and also with regard to the operating costs) and also a higher yield or number of chips per wafer which can be achieved on account of one with the proposed combination method. If the advantage of the higher yield per wafer is outweighed by the possibly higher costs for processing a wafer, consideration can be given, in particular, to carrying out the dry etching (step 102) for as long as possible. This depends, in particular, on how accurately the etching depth can be controlled and supervised during dry etching. The dry etching should generally stop before the desired final depth of the cavity is attained, since otherwise there is the risk of attacking or even destroying microelectromechanical structures which lie in an extension of the final cavity or at the bottom of the cavity. By way of example, the proportion of dry etching can be two thirds, relative to the final depth of the cavity. Alternatively, the proportion of dry etching can be between 30% and 90% and have in particular the following values: 30%, 50%, 75%, 80% or 90%, in each case relative to a final depth of the cavity to be produced.

The step of electrochemical etching 108 generally stops automatically at a predefined depth, which is achieved by providing a corresponding etching stop (e.g. in the form of a pn junction with electrical voltage applied thereto).

As a possible application, exemplary embodiments afford the possibility of significantly reducing the component area of an MEMS sensor (e.g. of a combined pressure and acceleration sensor) in order thus to accommodate as many sensor components as possible, each having as minimal an area as possible, on a wafer having a specific size (e.g. on a 6-inch wafer or an 8-inch wafer).

In the case of the combined pressure and acceleration sensor mentioned here as an example, e.g. the focus can be directed at reducing the sensor area in the acceleration sensor, which is ultimately intended to be operated with the same sensitivity as its counterpart having a larger area. For this purpose, it will generally be endeavored to ensure that the inertial mass of the sensor remains as far as possible identical, since it is only then that a largely identical resonant frequency with which the sensor is operated is obtained.

This is achieved by the lithographically patterned wafer rear side (wafer material for example silicon) firstly being removed by means of a Bosch etch (using an oxide hard mask or a negative resist that is resistant to the etching medium). Substantially perpendicular etching sidewalls are obtained in the bulk silicon in this way. With the aid of the SPACER technique (plasma or thermal oxide deposition with subsequent anisotropic plasma etching), the perpendicular sidewalls of the Bosch-etched cavities are protected by means of an oxide layer and a subsequent electrochemical anisotropic etch (in TMAH, EDP, hydrazine, KOH or further customary basic etching media) leads the etching front as far as the depth of a space charge zone present in the p-type substrate (electrochemical etching stop before the reverse-biased pn junction-etching medium coming from the p-type region, stopping in the direction of the n-type region), which ultimately determines the membrane thickness (pressure sensor) or cantilever thickness (acceleration sensor).

One feature of the method in accordance with embodiments is the low price of silicon basic material in comparison with SOI ("silicon-on-insulator") basic material. A further possibility for obtaining small structure sizes in the case of MEMS sensor components by means of silicon bulk etching methods is the use of SOI basic material. However, no pn etching stop method and therefore no combination process is used in this case. This principle is usually based exclusively on the use of the Bosch etching process. In this case, an etching stop is effected on the oxide layer of the SOI material. MEMS products composed of SOI basic material and use of Bosch etching methods therefore have predominantly perpendicular etching sidewalls.

Exemplary embodiments are therefore based on the "combination process" described herein (a variation of "silicon micromachining") for producing MEMS silicon sensor components and also other MEMS components or electronic components on the basis of silicon wafers. Alternatively, other semiconductor materials are also conceivable. This technique makes it possible to reduce the required wafer area (in particular silicon wafer area) and accordingly the area of the components, in particular silicon sensor components ("shrink").

Exemplary embodiments comprise the described process sequence for producing cavity structures e.g. in the bulk ultrapure silicon <100>:

a) Bosch etching process (DRIE) using a positive or negative resist mask
b) Plasma CVD deposition and anisotropic etching of an undoped silicon glass (SPACER technology) for protecting the perpendicular silicon sidewalls of the Bosch-etched cavities
c) electrochemical anisotropic etching in a basic medium with an etching stop technique (the etching stop is effected in the depth profile before the space charge zone of a reverse-biased pn junction produced for example by means of lithography and implantation technology).

Figure 2:
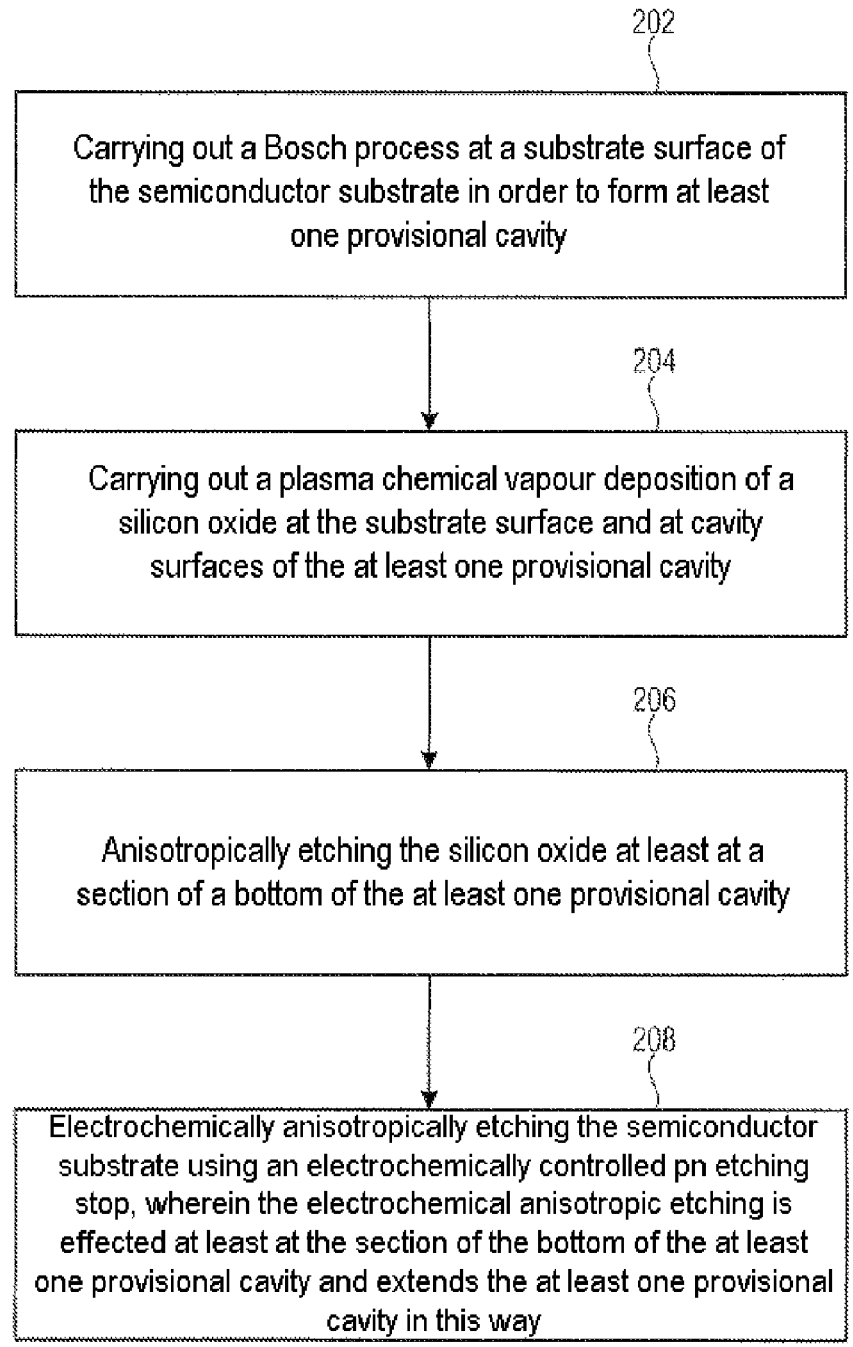
FIG. 2 shows a schematic flowchart of a method for producing at least one cavity within a semiconductor substrate in accordance with further exemplary embodiments.

FIG. 2 shows a schematic flowchart of a method for producing at least one cavity in accordance with further possible exemplary embodiments. The method begins, in a step 202, with carrying out a Bosch process at a substrate surface of the semiconductor substrate in order to form at least one provisional cavity.

This is followed by carrying out a plasma chemical vapour deposition (CVD) of a silicon oxide (or else of some other oxide) at the substrate surface and at cavity surfaces of the at least one provisional cavity. The silicon oxide is generally also deposited at areas which do not run parallel to the substrate surface, as is the case e.g. for the sidewalls of the provisional cavity. The silicon oxide serves in particular as a protective material for a subsequent etching step (see step 208 and the subsequent associated description).

As indicated in a step 206 of the schematic flowchart of FIG. 2, the silicon oxide is subsequently anisotropically etched, to be precise at least at a section of a bottom of the at least one provisional cavity. In this way, the silicon oxide is removed in this region and the corresponding section of the bottom is exposed, that is to say that the substrate material is no longer covered by silicon oxide at this location. In order to make possible a locally selective etching of the silicon oxide at the desired locations, i.e. at the at least one section of the bottom of the provisional cavity(-ies), step 206 can be preceded by a photolithography step or some other suitable process for the masking/demasking of surface regions.

The method for producing at least one cavity within the semiconductor substrate is continued after the anisotropic etching of the silicon oxide with electrochemical anisotropic etching of the semiconductor substrate, as can be seen in step 208. The electrochemical anisotropic etching is effected using an electrochemically controlled pn etching stop, wherein the electrochemical anisotropic etching is effected at least at that section of the bottom of the at least one provisional cavity which had been exposed previously (step 206). In this way, the provisional cavity is extended, to be precise proceeding from the bottom of the provisional cavity with the etching profile which is characteristic of the electrochemical anisotropic etching method used. By way of example, the sidewalls of the cavity in the section produced by the electrochemical anisotropic etching can form a specific angle with the substrate surface, e.g. the crystal angle between the Si <100> and Si <111> planes of 54.7°.

Figure 3:
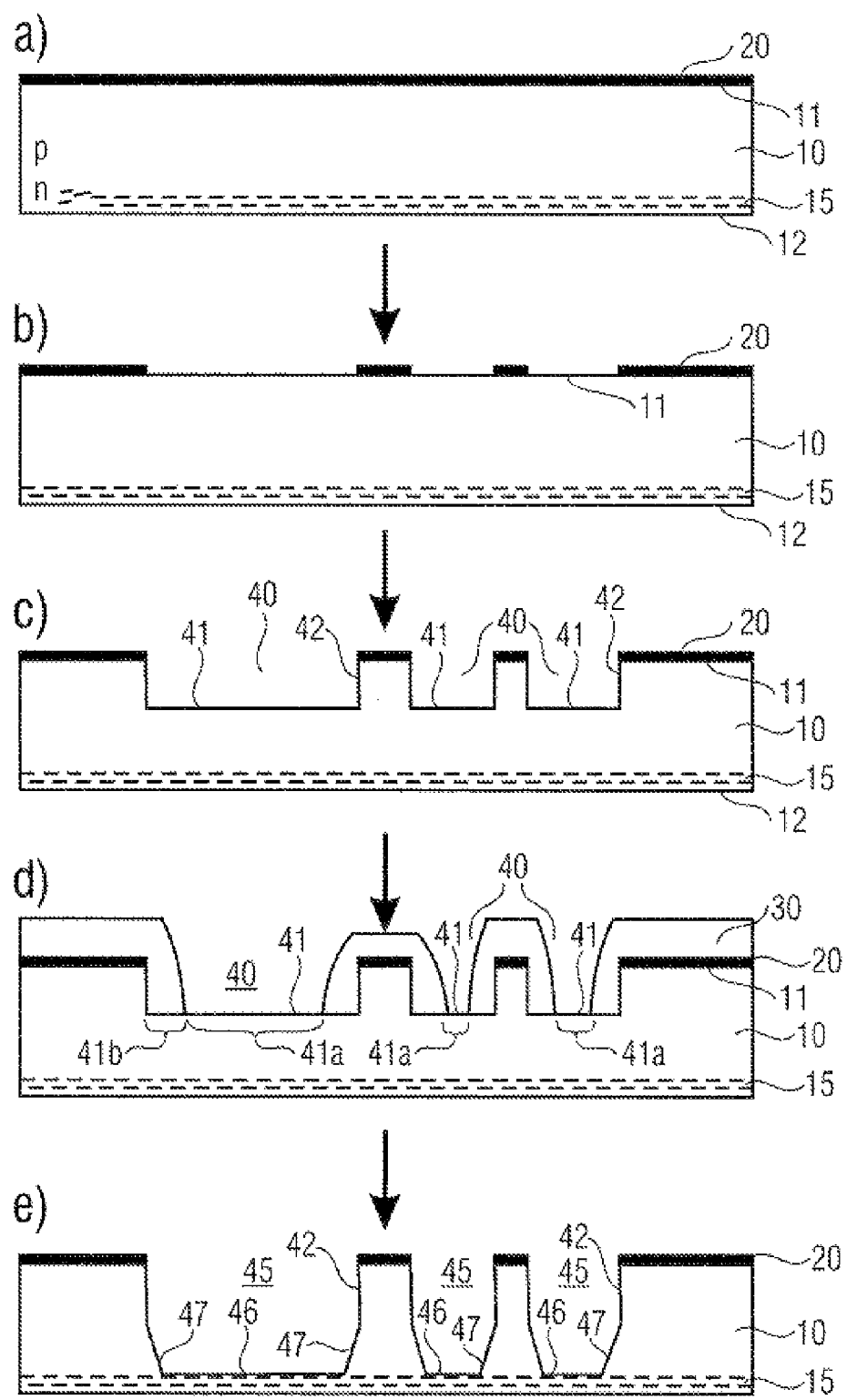
FIG. 3 illustrates, in schematic cross-sectional views through a semiconductor substrate, the method for producing at least one cavity in accordance with exemplary embodiments.

FIG. 3 shows a schematic illustration of the proposed combination process in five schematic cross-sectional views each illustrating an intermediate step of the combination process.

Sub-FIG. a) of FIG. 3 illustrates a substrate 10 in cross section. The substrate is p-doped, which can be achieved for example by implanting boron atoms into the crystal lattice, here silicon. In the example illustrated here, the substrate is assumed to be a silicon crystal whose <100> plane is formed by the main faces of the substrate 10, namely a first surface 11 and a second surface 12. It is taken into consideration that in MEMS technology the microelectromechanical structures are often created and arranged beforehand at that surface of the substrate 10 which is designated here as second surface 12. At the second surface 12 or in proximity thereto, a redoped region 15 is provided within the substrate 10. In the example illustrated here of a p-doped substrate 10, the redoped region 15 is therefore n-doped. The redoping can be obtained by virtue of the fact that in the redoped region 15 the concentration of a second dopant is higher than the concentration of the first dopant (here e.g. boron), which is substantially homogenous in the entire substrate 10. In this way, a pn junction is formed between the redoped region 15 and the rest of the substrate 10. In the example of FIG. 3, the redoped region 15 in this case constitutes the n-type region and the rest of the substrate 10 constitutes the p-type region.

Sub-FIG. a) of FIG. 3 also illustrates an oxide layer 20 arranged at the first surface 11 of the substrate 10. The oxide layer 20 serves, as explained subsequently, as a hard mask for the dry etching process or Bosch process to be carried out later.

In sub-FIG. b) of FIG. 3, the oxide layer 20 has in the meantime been patterned by means of a lithography method. In this way, the first surface 11 of the substrate 10 is exposed at the intended cavity locations and still covered by the oxide hard mask 20 outside the intended cavity locations.

Sub-FIG. c) of the process sequence of FIG. 3 reveals the substrate 10 in cross section after a Bosch process with a positive resist or negative resist was carried out. The Bosch process produces provisional cavities 40, which can have a depth of 300 μm, for example, measured from the first surface 11 of the substrate 10. The Bosch process or some other suitable dry etching process constitutes a first partial process of the method for producing at least one cavity in accordance with exemplary embodiments. The provisional cavities 40 each have a bottom 41. The cavities 40 furthermore have sidewalls 42, which here are substantially perpendicular to the first surface 11 of the substrate 10.

Sub-FIG. d) of FIG. 3 reveals the state after an oxide SPACER deposition/anisotropic etch was carried out. Firstly, a protective material 30 (here: oxide SPACER material) was deposited at the first surface 11 of the substrate 10 and at the surfaces of the provisional cavities 40. By means of a local anisotropic etch of the protective material 30, in particular sections 41a of the bottoms 41 of the provisional cavities 40 are exposed again. Furthermore, in the example illustrated here, the bottoms 41 also have non-exposed sections 41b. The thickness of the deposited protective material can be between 0.5 µm and 10 µm, for example 2.5 µm. The anisotropic etch substantially completely removes the protective material 30 in the sections 41a to be exposed, such that the bottom 41 of the provisional cavities 40 (and thus the substrate material) is exposed (at least in sections). The protective material deposition and its (anisotropic) etch constitute a further step or process section of the method for producing a cavity within the semiconductor substrate 10.

Sub-FIG. e) of FIG. 3 illustrates the state as a cross-sectional view after a pn etch (anisotropic and electrochemical) was carried out, which constitutes a further step of the proposed method for producing a cavity. Subsequent removal of the oxide layers was likewise carried out between the states in sub-FIGS. d) and e). The sidewalls of the cavities 45 now formed have a first section 42, which was already produced in the context of the dry etching process between sub-FIGS. b) and c). These sections 42 are continued by second sections 47 attributed to the pn etch. Accordingly, the second sections 47 of the sidewalls of the cavities 45 do not necessarily run substantially perpendicularly to the substrate surface 11, but rather at an angle with respect thereto, for example at an angle of between 40° and 65°, e.g. in particular 54.7°. The angle of the first sections 42 of the sidewalls of the cavities 45 typically forms an angle with the first surface 11 that is between 70° and 110°, in particular between 85° and 95°.

The cavities 45 have a bottom 46 adjoining the redoped regions 15. This is owing to the fact that the redoped region 15 constitutes an etching stop for the pn etch.

One possible embodiment of the invention chosen here as an example is implemented at a pressure and an acceleration sensor on a common sensor component area. Here the wafer-rear-side cavities are etched into the <100>-silicon basic material by means of the combination process described. The total depth can vary in this case; customary etching depths depend on the required membrane thickness or that of the cantilever of the acceleration sensor and here are approximately 375 µm or 400 µm, respectively. The etching depth is also dependent on the original wafer thickness.

Furthermore, consideration is given to inserting two spring-mass systems situated antiparallel to one another in a cavity, in order to provide a so-called two-axis acceleration measuring system. On account of the use of the combination process in accordance with exemplary embodiments, these two structure elements can be integrated in a cavity in a space-saving manner and can also be patterned by this process.

The masses of the acceleration sensors are small in terms of area, since the combination process makes possible a mass thickness corresponding to that of the silicon wafer.

By varying an implantation depth of the second dopant, which is used to form the redoped region 15 in the substrate 10, it is possible to provide different etching stop depths for the pn etch. In this way, e.g. a plurality of cavities of different depths can be produced during the same pn etch. Furthermore, it is possible to pattern the bottoms 46 of the produced cavities 45 (FIG. 3e) in this way, by providing e.g. elevated structures, depressions or cutouts.

Figure 4:
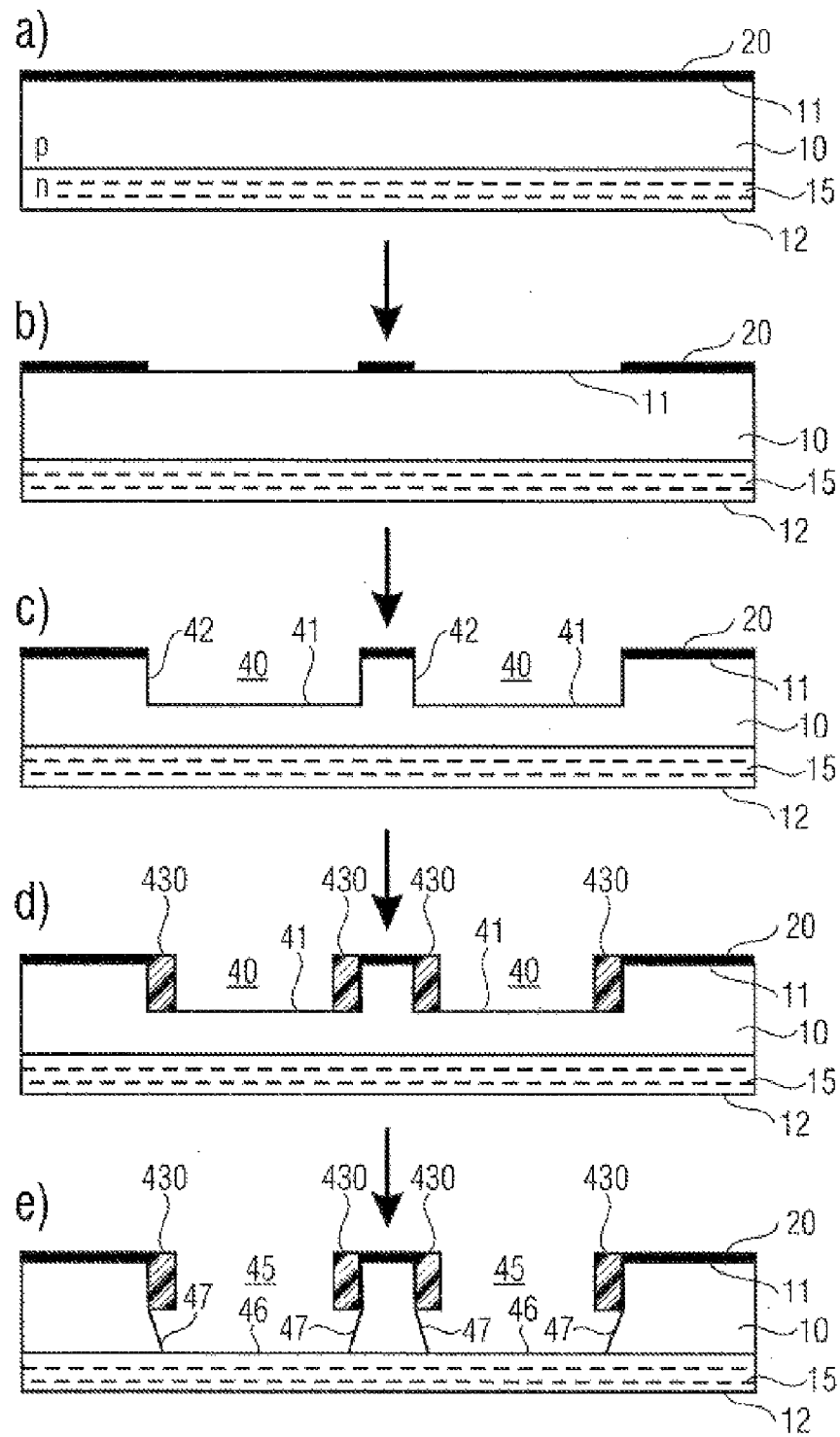
FIG. 4 illustrates, in schematic substrate cross sections, the method for producing at least one cavity in accordance with further exemplary embodiments.

FIG. 4 shows a process sequence in accordance with exemplary embodiments in schematic cross-sectional views. As in FIG. 3, the starting point is once again a substrate 10 having a p-doping by means of implantation of boron atoms. By way of example, a resistivity of approximately 3 Ωcm can thereby be achieved. The layer 20 constitutes an oxide hard mask. The substrate has in proximity to or directly at the second substrate surface 12 a redoped region 15, which is therefore n-doped.

In sub-FIG. b) of FIG. 4, a lithography of the oxide hard mask 20 was carried out, such that the oxide hard mask 20 was removed at two intended cavity locations.

Between the states illustrated in sub-FIGS. b) and c) of FIG. 4, a Bosch process was carried out, which leads to the formation of provisional cavities 40 having substantially perpendicular sidewalls 42 and in each case a bottom 41. The Bosch process can be performed for example over an etching depth of 200 µm in the so-called AVIZA method.

Sub-FIG. d) of FIG. 4 shows the substrate 10 and the structures created in the meantime in cross section, according to which a protective material 430 was arranged on the sidewalls of the provisional cavities 40. This can be done for example by means of a polymer deposition. The thickness of the deposited polymer or protective material 430 can be between 150 nm and 500 nm and likewise proceed in the AVIZA reaction. It is taken into consideration that the Bosch process carried out previously typically provides a polymer deposition anyway on the sidewalls of the provisional cavity 40 gradually arising.

The method is then continued with a pn etch (electrochemical etch), whereby the provisional cavity 40 is extended in particular into the depth to form a final cavity 45. In this case, the sidewalls 42 of the provisional cavity 40 continue by means of obliquely running sidewall sections 47 as far as the redoped region 15. Upon reaching the redoped region 15, the pn etch stops and the final cavity 45 has a cavity bottom 46 at this location.

Figure 5:
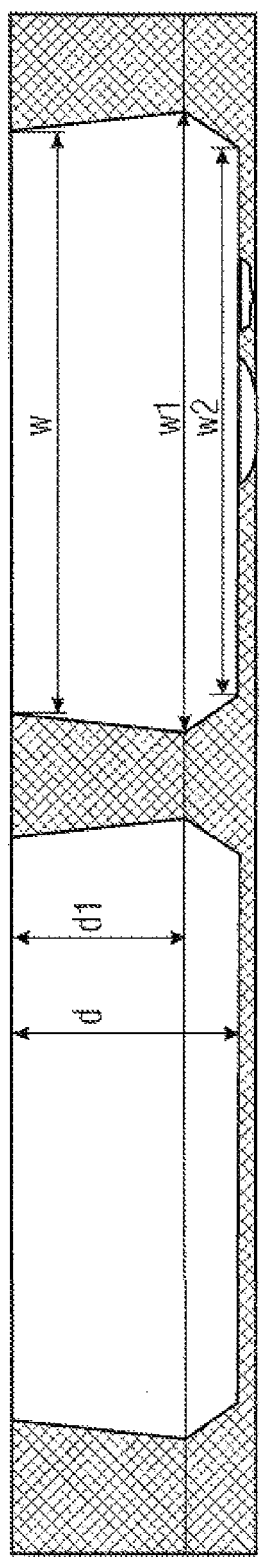
FIG. 5 shows a schematic cross-sectional view of two cavities which were produced by a method in accordance with exemplary embodiments.

FIG. 5 shows a schematic cross-sectional view of two cavities produced by means of a method in accordance with exemplary embodiments. The cavities have a total depth d from a substrate surface from which the two cavities extend into the substrate. At the substrate surface, the cavities have a lateral extent w. As far as a depth d1, the sidewalls of the cavities run at an angle with respect to the substrate surface that is approximately 95°. Consequently, the cavities initially widen slightly with increasing depth. Such a widening occurs if the Bosch process is not set optimally. Polymer deposition and silicon etching rates have to be set exactly relative to one another in order to obtain perpendicular sidewalls. It should be noted, however, that only few applications require (almost) exactly perpendicular sidewalls. For many other applications it is sufficient if approximately perpendicular sidewalls (e.g. having an angle of between 80° and 100°) can be produced. At the depth d1, the lateral extent attains a maximum w1. The section corresponding to the depth d1 is typically attributed to carrying out a dry-etching method or a Bosch etching process. Proceeding from the depth d1, the lateral extent of the cavities decreases with increasing depth and finally attains a value w2 at the bottom of the cavities. In the depth range d1 to d, the sidewalls of the cavities form an angle with the substrate surface that is between 40° and 65°.

It is taken into consideration that the bottom of the right-hand cavity has a structure which can be used for a microelectromechanical structure.

Figure 6:
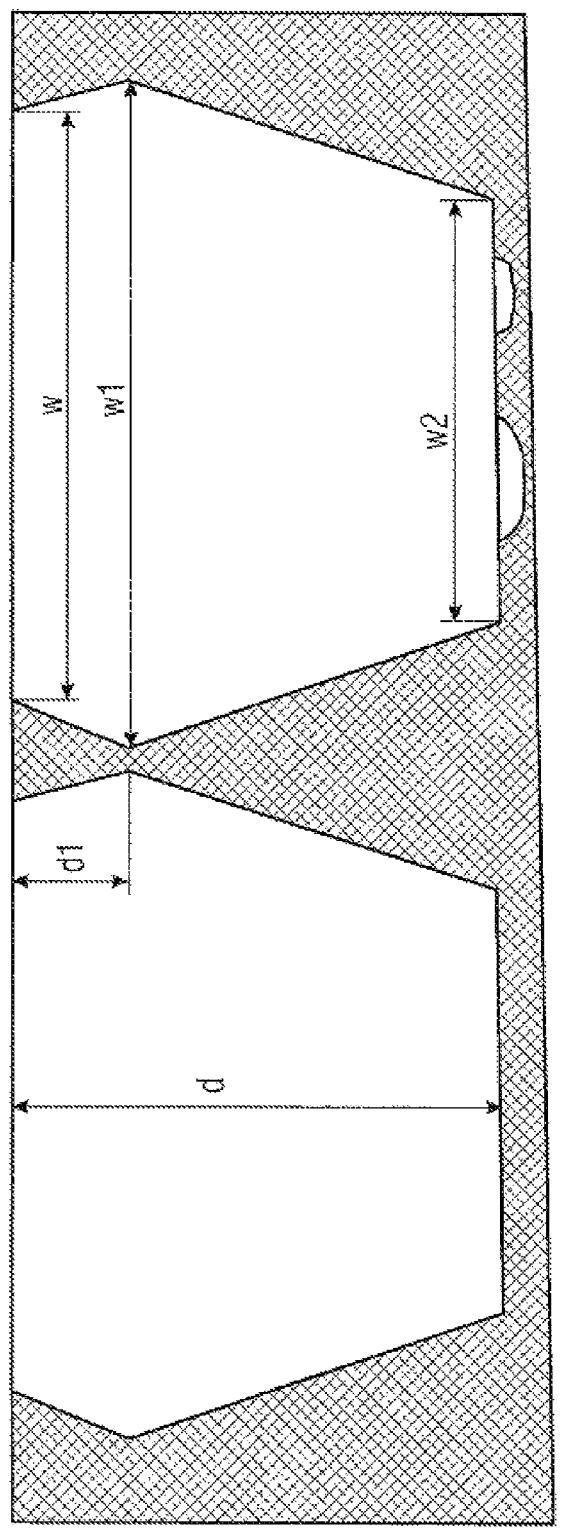
FIG. 6 shows a schematic cross-sectional view of two cavities which were produced by the method in accordance with further exemplary embodiments.

FIG. 6 shows, in comparison with FIG. 5, a schematic cross section through two cavities produced by means of a combination process but without the deposition of a protective material between the dry etch and the electrochemical etch. Furthermore, the ratio of the depths produced by means of the dry-etching process and the electrochemical etching process is different from that in the example illustrated in FIG. 5. In particular, in the example illustrated in FIG. 6, the electrochemical etch is predominant, whereas the dry etch is predominant in FIG. 5. Since the sidewalls of the provisional cavity were not protected by a protective material during the electrochemical etch, they are also attacked by the electrochemical etch. At the depth d1, the cavities have their maximum lateral extent w1. At this location, a remaining wall thickness between the two cavities is already relatively small. Therefore, when using the process which led to the production of the cavities illustrated in FIG. 6, the lateral distance between the two cavities cannot be reduced further, even though the microelectromechanical structures arranged in the region of the respective cavity bottoms would indeed permit such a reduction of the lateral distance. It is taken into consideration that the Bosch etching process was carried out approximately as far as a depth of 2×d1. In comparison with the configuration of FIG. 5, the ratio w1/w2 is greater in the case of the configuration in accordance with FIG. 6, which has the effect that a lateral area utilization in the case of the configuration in accordance with FIG. 6 is less favourable than that in FIG. 5. If the initial dry etch or the initial Bosch process is completely dispensed with and the cavity is produced exclusively by means of the pn etch, the obtainable area utilization would be even less favourable still.

Figure 7:
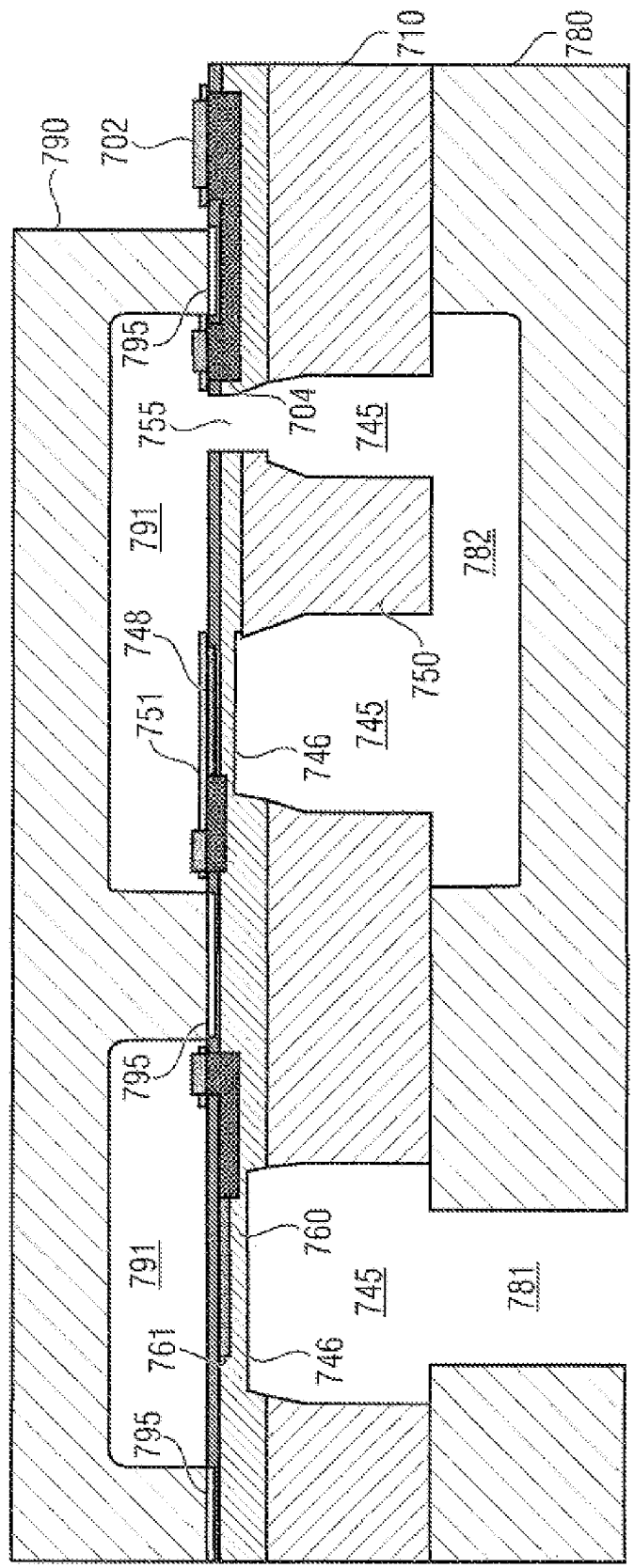
FIG. 7 shows a schematic cross-sectional view of a microelectromechanical system, a covering wafer and an access wafer.

FIG. 7 shows a schematic cross-sectional view through a microelectromechanical system having a layered construction composed of three wafers. A main wafer 710 is arranged in a sandwich-like manner between an access wafer 780 and a covering wafer 790. The structure illustrated in FIG. 7 forms a combined pressure and acceleration sensor. For this purpose, the main wafer 710 has a pressure-sensitive membrane 760 adjoining the bottom 746 of the cavity 745. The cavity 745 was produced by means of a method for producing a cavity in accordance with at least some exemplary embodiments. On a side of the pressure-sensitive membrane 760 which is opposite the cavity 745, the covering wafer 790 has a cavity 791 serving as a pressure chamber or reference pressure chamber for the pressure measurement. For this purpose, the main wafer 710 and the covering wafer 790 are connected to one another substantially in a gas-tight manner at least in the region of the cavity 791. A channel 781 is implemented in the access wafer 780, said channel leading to the cavity 745 and connecting the latter to the surroundings of the pressure sensor, such that the pressure prevailing in the surroundings can act on the membrane 760 and deform the latter, if appropriate. The membrane 760 can contain buried resistors 761 configured for converting the pressure-governed deformation of the membrane into a resistance change, which can be evaluated electrically. The membrane 760 can have a thickness of e.g. 5 μm to 20 μm, in particular 10 μm, wherein these values should be regarded merely by way of example and in no way as restrictive.

The acceleration sensor part of the microelectromechanical sensor system is formed to the right of the pressure sensor.

The covering wafer 790 is connected to the main wafer 710 by means of anodic (wafer) bonding 795.

The acceleration sensor has a mass 750, which is connected to the substrate of the main wafer 710 via a cantilever arm 751. The cantilever arm 751 is delimited by the cavity bottom 746 on its side facing the cavity 745. On account of the cantilever arm suspension, the mass 750 can oscillate and thus react to an acceleration. A deformation of the cantilever arm 751 can be measured with the aid of surface resistors 748. A further cavity 745 is provided to the right of the mass 750. Said further cavity 745 passes through the main wafer 710 until it reaches one of the cavities 791 formed in the covering wafer 790. The cavities 745 situated to the left and right of the mass 750 are also connected to a cavity 782 implemented in the access wafer 780.

The combined pressure and acceleration sensor is electrically connected via main contacts 702 and buried, horizontal feedthroughs 704. By way of example, the thickness of the main wafer 710 can be approximately 400 μm, and the thickness of the covering and access wafers 790, 780 can be approximately 350 μm.

In FIG. 7 it can also be discerned that the cavities 745 in the main wafer 710 have sidewalls having a first section and a second section. The first section extends substantially perpendicularly to a surface of the main wafer 710. By contrast, the second section of the sidewalls runs at a non-perpendicular angle with respect to the surface of the main wafer 710. In particular for the mass 750 of the acceleration sensor this is advantageous since the mass can maintain comparable lateral dimensions in comparison with earlier methods, but at the same time can utilize the complete wafer thickness. As a result, the mass of the element 750 increases, or, with the mass remaining substantially the same, smaller lateral dimensions can be chosen.

Figure 8:
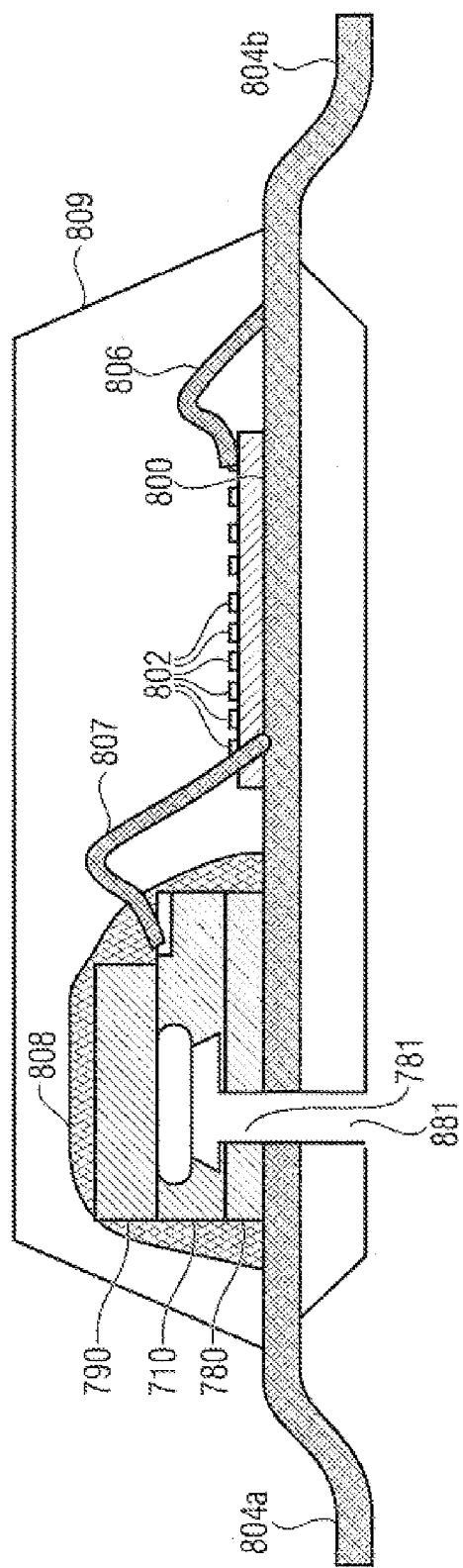
FIG. 8 shows a schematic cross-sectional view of a sensor device geometry.

FIG. 8 shows by way of example a sensor device geometry into which the arrangement from FIG. 7 is integrated. The sensor device has a housing 809 and connections 804a, 804b. The construction illustrated in FIG. 7 and a driving and/or evaluation chip 800 are arranged within the housing. The chip 800 is connected by means of electrical connections 806, 807 to one of the contacts 804b and to the main contacts 702 (FIG. 7) of the main wafer 710. The arrangement shown in FIG. 7 is encapsulated within the housing 809, as indicated by the encapsulation 808. The access channel 781 of the access wafer 780 communications with a hole 881 implemented in the housing 809. The contact 804a is electrically insulated from the contact 804b and constitutes an earth connection, for example. It is taken into consideration that, alongside the two contacts 804a, 804b illustrated here, further contacts can be provided in order to supply the sensor device with electrical energy and be able to pass out measured signals.

Figure 9:
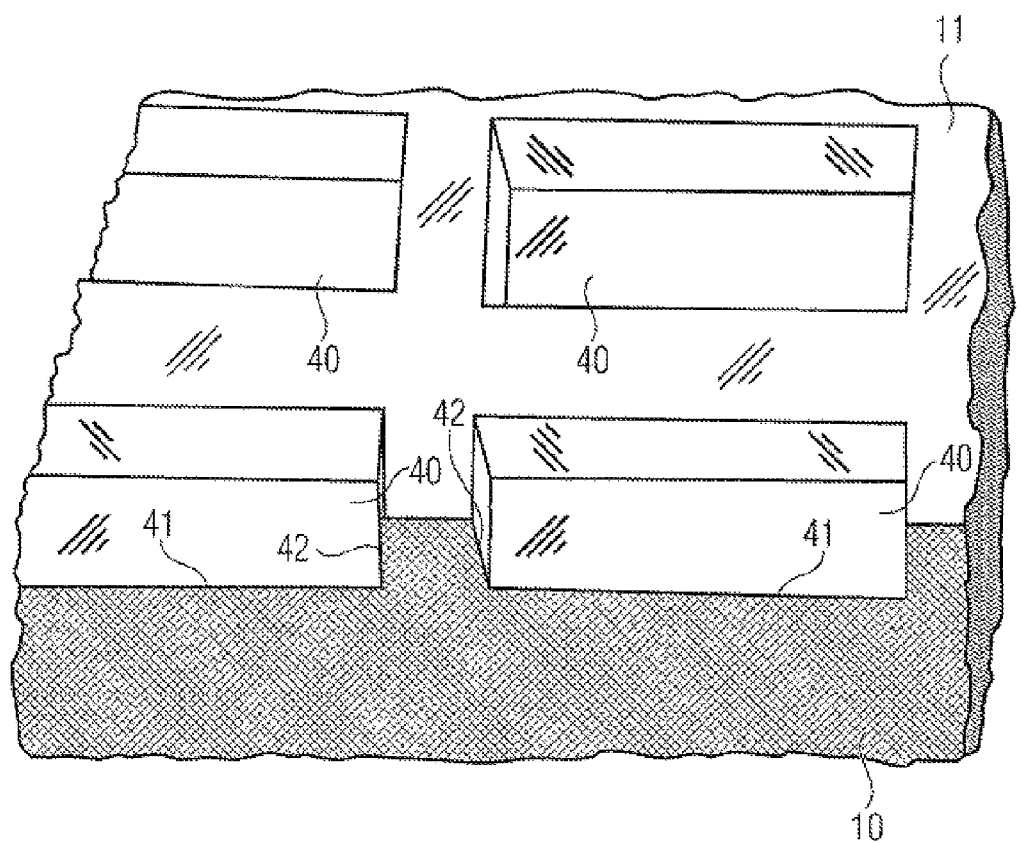
FIG. 9 shows a schematic, perspective cross-sectional view of four provisional cavities which are formed in the context of the method for producing at least one cavity in accordance with exemplary embodiments.

FIG. 9 shows a schematic, perspective cross-sectional view of four provisional cavities. The four provisional cavities here have rectangular outlines, but other shapes are also conceivable. The sidewalls of the provisional cavities have an angle with respect to the substrate surface that is somewhat greater than 90°.

Figure 10:
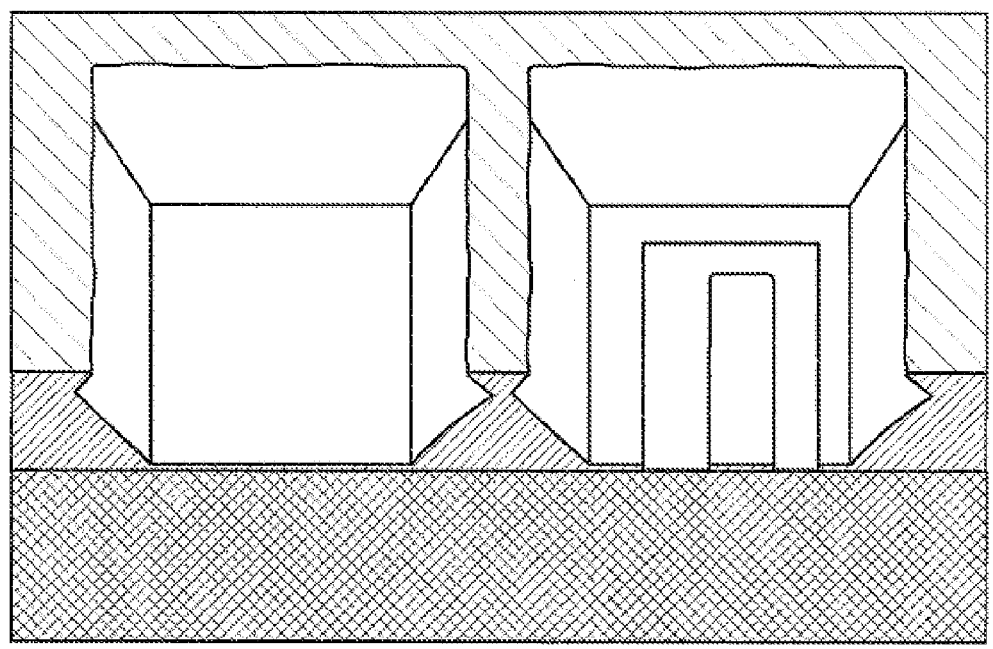
FIG. 10 shows a schematic, perspective cross-sectional view of two cavities which were produced by the method for producing at least one cavity in accordance with exemplary embodiments.

FIG. 10 shows a schematic, perspective cross-sectional view of two final cavities produced by means of Bosch etching after oxide hard mask patterning without polymer deposition, and by means of pn etching (after resist removal). As already mentioned in connection with FIG. 6, the lack of polymer deposition has the effect that the sidewalls of the provisional cavity produced during the Bosch etch are not protected during the subsequent pn etch. Therefore, the originally almost perpendicular surface sidewall sections are partly etched away until an <111> crystal plane which effectively acts as an etching stop is reached.

A structure indicating the mass element 750 (see FIG. 7) of the acceleration sensor can be discerned in the bottom of the right-hand cavity.

Figure 11:
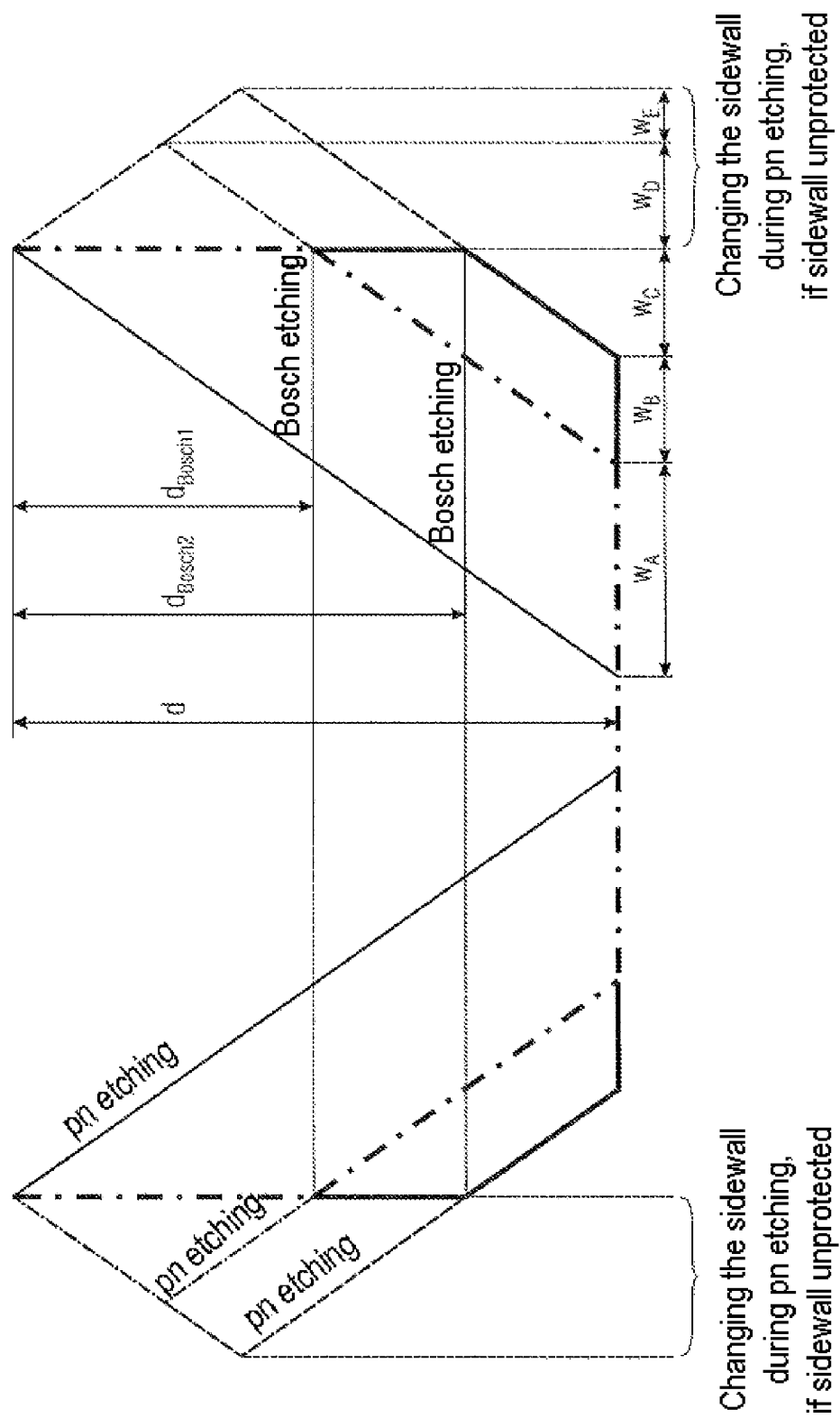
FIG. 11 shows a schematic illustration of different etching patterns which can be obtained by means of different etching methods or combinations of etching methods.

FIG. 11 shows a schematic illustration of etching patterns which can be achieved by means of different etching methods or combinations of different etching methods. It is assumed that a cavity having a depth d is intended to be produced and that the same attack area is available to all etching methods or combinations of etching methods at the substrate surface.

The etching pattern which can be obtained by means of a pn etch will be considered first of all. On account of the relatively shallowly inclined sidewalls, the cross section of the cavity produced decreases with increasing depth. In the example illustrated in FIG. 11, the cavity produced by the pn etch has only a very small lateral extent at the depth d.

Furthermore, FIG. 11 also illustrates the etching patterns of two different combination processes comprising Bosch etching and pn etching. The two combination processes differ with regard to their Bosch etching proportion.

In the first combination process, firstly a provisional cavity is etched by means of the Bosch process with a depth $d_{Bosch1}$. The Bosch etching proportion is therefore $d_{Bosch1}/d$. In the case of the second variant, the Bosch etching proportion is higher, such that the provisional cavity produced in this way has a depth $d_{Bosch2} > d_{Bosch1}$ (Bosch etching proportion=$d_{Bosch2}/d$ in this case).

In both cases, a pn etch follows. Two cases can be differentiated here: in the first case, the sidewalls of the provisional cavity are protected by a corresponding protective material during the pn etch and are therefore substantially not attacked. In the second case, the sidewalls are unprotected during the pn etch and are therefore likewise changed, which leads to a widening of the cavity in this region.

The following values shall also be specified as examples: $d=400$ μm, $d_{Bosch1}=200$ μm and $d_{Bosch2}=300$ μm. The numerical values specified below should also be regarded expressly as an example.

FIG. 11 illustrates that by means of the first combination process the lateral extent of the cavity at the bottom thereof can be increased by the value $2w_A$ relative to the exclusively pn-etched cavity. Referring to the numerical examples specified above, $w_A=140$ μm would apply. In the case of the second combination process (Bosch etching down to a depth $d_{Bosch2}$), the base of the final cavity even has an increase of $2(w_A+w_B)$ relative to the exclusively pn-etched cavity.

Referring to the numerical values specified above, $w_B$ would in this case be e.g. 72 μm.

Precisely in MEMS technology, the required lateral extension of the bottom of the cavity determines the size of the cavity, in particular the maximum lateral extent thereof FIG. 11 illustrates that a Bosch etching proportion that is as high as possible affords advantages in this respect. In practice, a compromise will often be sought which takes account of the different apparatus and process costs for Bosch etching and pn etching, and the better area utilization that can be obtained. Furthermore, it should be taken into consideration that pn etching typically provides a better controllable etching stop by comparison with Bosch etching and thus allows more precise manufacture of MEMS structures.

In the first combination process, the lateral extension of the cavity bottom by the amount $2(w_B+w_C)$ is less than the lateral extension of the provisional cavity produced by the Bosch etch. Once again with reference to the numerical values specified above, $w_C$ would here be 68 μm.

FIG. 11 also illustrates a change in the sidewall of the provisional cavity during the pn etch if the sidewall is not protected by a suitable protective material during the pn etch. In the first combination process (Bosch etching as far as $d_{Bosch1}$), the cavity is enlarged in a lateral direction by the value $2w_D$, where $w_D$ with the numerical values specified above is 72 μm. In the second combination process (Bosch etching as far as $d_{Bosch2}$), the increase in the maximum lateral extent is $2(w_D+w_E)$ relative to the lateral extent of the provisional cavity, where $w_E$ is 32 μm, assuming the numerical values specified above.

The following table summarizes the exemplary numerical values for the dimensions shown in FIG. 11.

| | |
|---|---|
| d | 400 μm |
| $d_{Bosch1}$ | 200 μm |
| $d_{Bosch2}$ | 300 μm |
| $w_A$ | 140 μm |
| $w_B$ | 72 μm |
| $w_C$ | 68 μm |
| $w_D$ | 72 μm |
| $w_E$ | 32 μm |

Figure 12:
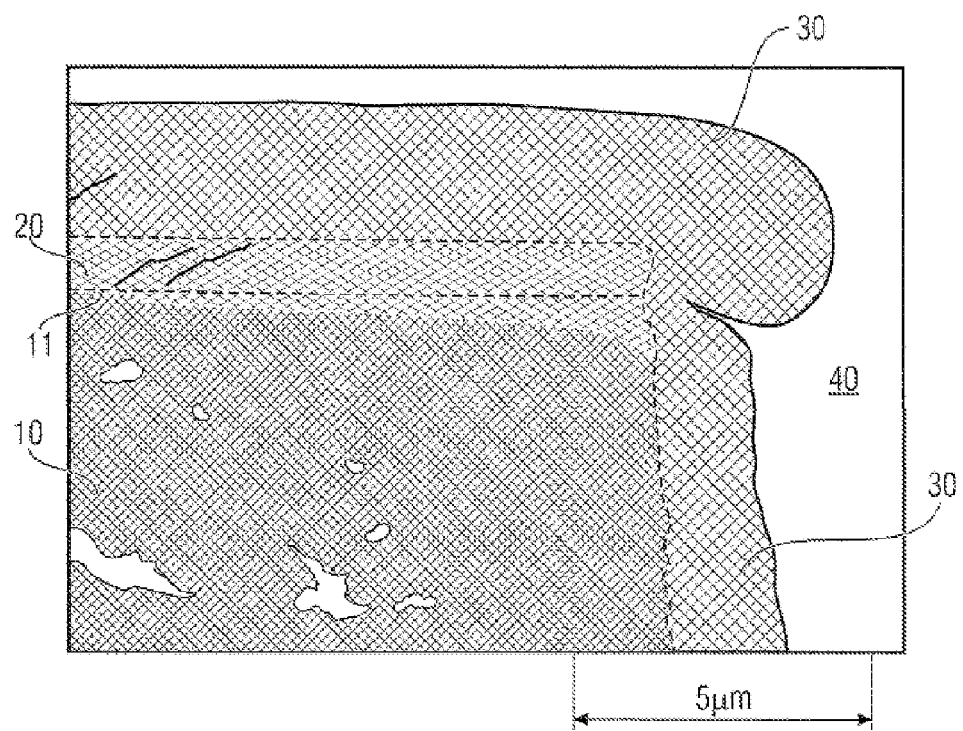
FIG. 12 shows, as an electron microscope micrograph, a detail sectional view of an upper edge of a cavity sidewall.

FIG. 12 shows an electron microscope micrograph of a detail sectional view (or, in the case of a corresponding change, a schematic detail sectional view as line drawing) of an upper edge of a cavity sidewall, which reveals the protective material 30 at the surface of the substrate 10 and at the sidewall. As can be seen in FIG. 12, a protective oxide thickness of the protective material 30 of approximately 2500 nm was chosen. The thickness typically has to be chosen such that at the bottom and at the lower corners of the provisional cavity 40 a sufficient protective oxide thickness is present in order to avoid incipient etching of the lower corners and/or of the sidewalls during the subsequent plasma etching. The protective oxide thickness of the layer 30 is not conformal: it is thinner at the sidewall than on the substrate top side. On the substrate top side 11, an oxide layer 20 (also cf. FIG. 3) is situated between protective oxide layer 30 and silicon substrate 10. For better illustration, the boundaries between the substrate 10, the oxide layer 20 and the protective oxide layer 30 are indicated by dashed lines in FIG. 12.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some exemplary embodiments, some or a plurality of the most important method steps can be performed by such an apparatus.

The exemplary embodiments described above merely constitute an illustration of the principles of the present invention. It goes without saying that modifications and variations of the arrangements and details described herein will become apparent to other persons skilled in the art. Therefore, it is intended that the invention be restricted only by the scope of protection of the appended patent claims, rather than by the specific details presented on the basis of the description and the explanation of the exemplary embodiments herein.

In the detailed description above it can be seen that different features are grouped together in exemplary embodiments. This manner of disclosure should not be understood as an intention that the claimed exemplary embodiments require more features than are explicitly mentioned in the respective claim. Rather, the situation is such that inventive content may reside in fewer than all features of an individual exemplary embodiment disclosed. Therefore, the following claims should hereby be deemed to be incorporated in the description, wherein each claim by itself can stand as a separate exemplary embodiment. Although each claim by itself can stand as a separate exemplary embodiment, it should be noted that—although a dependent claim can refer in the claims to a specific combination with one or a plurality of claims—other exemplary embodiments can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some exemplary embodiments, an individual step/action can be subdivided into a plurality of sub-steps or contain a plurality of sub-steps. Such sub-steps can be contained in the disclosure of the individual step and be part of the disclosure of the individual step.

The invention claimed is:

1. A method for producing at least one cavity within a semiconductor substrate, the method comprising:
   carrying out a dry etch process at a substrate surface of the semiconductor substrate in order to form at least one provisional cavity;
   carrying out a plasma chemical vapour deposition of a silicon oxide at the substrate surface and at cavity surfaces of the at least one provisional cavity;
   anisotropically etching the silicon oxide at least at a section of a bottom of the at least one provisional cavity; and
   electrochemically anisotropically etching the semiconductor substrate using an electrochemically controlled pn etching stop, wherein the electrochemical anisotropic etching is effected at least at the section of the bottom of the at least one provisional cavity and extends the at least one provisional cavity in this way, wherein the electrochemical anisotropic etching comprises a first temporal segment, during which an electrical voltage applied to the semiconductor substrate is increased, and a second temporal segment, during which the electrical voltage applied to the semiconductor substrate is kept constant.

2. The method according to claim 1, further comprising:
   depositing an oxide mask for the dry etch process prior to the dry etch process.

3. The method according to claim 1, wherein anisotropically etching the silicon oxide comprises plasma etching.

4. The method according to claim 1, further comprising:
   depositing a mask and patterning the deposited mask prior to anisotropically etching the silicon oxide.

5. The method according to claim 1, wherein a basic etching medium is used for the electrochemical anisotropic etching.

6. The method according to claim 1, further comprising:
   carrying out a lithography process and a subsequent implantation in order to form a pn junction at a depth within the semiconductor substrate, wherein the depth of the pn junction is chosen in a manner dependent on a desired depth of the bottom of the at least one cavity.

7. The method according to claim 1, wherein an etching medium used for the electrochemical anisotropic etching comprises tetramethylammonium hydroxide (TMAH), an aqueous solution of ethylenediamine and pyrocatechol (EDP), hydrazine, potassium hydroxide (KOH) or a combination thereof.

8. The method of claim 1, wherein the at least one provisional cavity comprises a first width at a first depth, a second width at a second depth, which is different from the first depth and the first width, and a third width at a third depth, wherein the third width is less than the first width and the second width, and the third depth is greater than the first depth and the second depth.

9. A method for producing at least one cavity within a semiconductor substrate, the method comprising:
   carrying out a dry etch process at a substrate surface of the semiconductor substrate in order to form at least one provisional cavity;
   carrying out a plasma chemical vapour deposition of a silicon oxide at the substrate surface and at cavity surfaces of the at least one provisional cavity;
   anisotropically etching the silicon oxide at least at a section of a bottom of the at least one provisional cavity; and
   electrochemically anisotropically etching the semiconductor substrate using an electrochemically controlled pn etching stop, wherein the electrochemical anisotropic etching is effected at least at the section of the bottom of the at least one provisional cavity and extends the at least one provisional cavity in this way;
   wherein the carrying out the dry etch process at the substrate surface of the semiconductor surface to form the at least one provisional cavity further comprises forming a sidewall of the cavity comprising a first section having a first depth, and the electrochemically anisotropically etching the semiconductor substrate further comprises forming a second section having a second depth that is greater than the first depth and in a greater proportion of the at least one provisional cavity than the first section of the at least one provisional cavity.

10. The method of claim 9, wherein the forming the sidewall comprises forming the first section to extend at a first obtuse angle, or a first acute angle with respect to the substrate surface, and the forming the second section comprises extending the sidewall at a second acute angle that is different than first obtuse angle or the first acute angle of the first section.

11. The method of claim 9, wherein the first section extends between 70 degrees and 110 degrees with respect to the surface and the second section extends at a second angle with respect to the surface of between 40 degrees and 65 degrees.

* * * * *